(12) United States Patent
Takakuwa et al.

(10) Patent No.: US 7,034,321 B2
(45) Date of Patent: Apr. 25, 2006

(54) ELECTRON BEAM EXPOSURE APPARATUS AND ELECTRON BEAM MEASUREMENT MODULE

(75) Inventors: Masaki Takakuwa, Tokyo (JP); Yoshinori Nakayama, Tokyo (JP); Gen Nakamura, Tokyo (JP)

(73) Assignees: Advantest Corporation, Tokyo (JP); Hitachi Ltd., Tokyo (JP); Canon Kabushiki Kaisha, Tokyo (JP)

( * ) Notice: Subject to any disclaimer, the term of this patent is extended or adjusted under 35 U.S.C. 154(b) by 326 days.

(21) Appl. No.: 10/624,423

(22) Filed: Jul. 21, 2003

(65) Prior Publication Data

US 2005/0023486 A1 Feb. 3, 2005

(30) Foreign Application Priority Data

Jul. 22, 2002 (JP) ............................. 2002-213198

(51) Int. Cl.
*H01J 37/304* (2006.01)
*H01J 37/244* (2006.01)
*G01R 29/24* (2006.01)

(52) U.S. Cl. ................................ 250/492.22; 250/397
(58) Field of Classification Search .................... None
See application file for complete search history.

(56) References Cited

U.S. PATENT DOCUMENTS

| 5,528,048 A | * | 6/1996 | Oae et al. | ............... | 250/492.22 |
| 6,946,665 B1 | * | 9/2005 | Muraki et al. | ........... | 250/492.1 |
| 6,969,862 B1 | * | 11/2005 | Muraki et al. | .......... | 250/492.22 |

FOREIGN PATENT DOCUMENTS

| JP | 10-270535 | 10/1998 |
| JP | 11-214482 | 8/1999 |

* cited by examiner

*Primary Examiner*—Jack I. Berman
(74) *Attorney, Agent, or Firm*—Muramatsu & Associates

(57) ABSTRACT

An electron beam exposure apparatus for exposing wafer by using an electron beam includes: an electron beam generator for generating the electron beam; a wafer stage for holding the wafer to be exposed; a current detector, provided on the wafer stage, for detecting a current of the electron beam; and a storage unit, provided on the wafer stage, for storing information indicating the current detected by the current detector.

13 Claims, 4 Drawing Sheets

ELECTRON BEAM EXPOSURE APPARATUS AND ELECTRON BEAM MEASUREMENT MODULE

This patent application claims priority from a Japanese patent application No. 2002-213198 filed on Jul. 22, 2002, the contents of which are incorporated herein by reference.

BACKGROUND OF THE INVENTION

1. Field of the Invention

The present invention relates to an electron beam exposure apparatus and an electron beam measurement module. More particularly, the present invention relates to an electron beam exposure apparatus that exposes wafer to light with high lithography precision by precisely controlling a current of an electron beam.

2. Description of the Related Art

In recent years, various types of electron beam exposure apparatus have been developed in order to increase throughput and resolution, with miniaturization of semiconductor devices. In order to achieve high throughput, it is effective to enlarge an area exposed by one shot of electron beam, to perform exposure using a plurality of electron beams, or the like. Moreover, in order to achieve high resolution, it is necessary to reduce aberration of an electron lens, to suppress Coulomb effect of the electron beam and the like. In addition, it is important to measure a beam current with high precision so as to accurately control dimensions of lithography. Japanese Patent Application Laying-Open No. 11-214482 discloses a stage device in which a load of wiring in a stage is reduced so as to improve dynamic characteristics of the stage. Japanese Patent Application Laying-Open No. 10-270535 discloses a stage device in which absorption of wafer in the stage is controlled wirelessly so as to improve the precision of the stage control.

However, according to the above-mentioned conventional techniques, it was impossible to precisely measure the current of the electron beam that was used for the exposure of the wafer.

SUMMARY OF THE INVENTION

Therefore, it is an object of the present invention to provide an electron beam apparatus and an electron beam measurement module, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, an electron beam exposure apparatus for exposing wafer by using an electron beam, comprises: an electron beam generator operable to generate the electron beam; a wafer stage operable to hold the wafer to be exposed; a current detector, provided on the wafer stage, operable to detect a current of the electron beam; and a storage unit, provided on the wafer stage, operable to store information indicating the current detected by the current detector.

The current detector may include a Faraday cup. The electron beam exposure apparatus may further comprise a signal processor, provided on the wafer stage, operable to convert the current detected by the current detector to a digital signal and to output the digital signal to the storage unit.

The signal processor may include: an IV converter operable to convert the current detected by the current detector to a voltage; and an AD converter operable to convert the voltage to the digital signal and to output the digital signal to the storage unit.

The electron beam exposure apparatus may further comprise a substrate provided in such a manner that the substrate is attachable and removable to/from the wafer stage, the current detector, the signal processor and the storage unit being provided on the substrate. The electron beam exposure apparatus may further comprise a first condenser, provided on the wafer stage, operable to accumulate power for operating the current detector and the storage unit. The electron beam exposure apparatus may further comprise a charging unit operable to charge the first condenser.

The electron beam exposure apparatus may further comprise: a chamber operable to accommodate the wafer stage and the charging unit; a shutter operable to divide a space within the chamber into a first space for accommodating the wafer stage and a second space for accommodating the charging unit; a first pump operable to decrease a pressure in the first space; a second pump operable to decrease a pressure in the second space; and an attaching/removing unit operable to remove the first condenser from the wafer stage and attach the first condenser to the charging unit.

The electron beam exposure apparatus may further comprise a second condenser operable to accumulate power for operating the current detector and the storage unit, wherein the attaching/removing unit removes the first condenser from the wafer stage and attaches the first condenser to the charging unit, and removes the second condenser from the charging unit and attaches the second condenser to the wafer stage.

The electron beam exposure apparatus may further comprise a communication unit operable to communicate the information stored in the storage unit; and an electron beam controller operable to control an output of the electron beam generator based on the information obtained via the communication unit.

According to the second aspect of the present invention, an electron beam measurement module for measuring a current of an electron beam, comprises: a current detector operable to detect the current of the electron beam; a storage unit operable to store information indicating the current detected by the current detector; and a substrate on which the current detector and the storage unit are mounted.

The electron beam measurement module may further comprise: an IV converter, mounted on the substrate, operable to convert the current detected by the current detector to a voltage; and an AD converter, mounted on the substrate, operable to convert the voltage to a digital signal and to output the digital signal to the storage unit.

The electron beam measurement module may further comprise a condenser, mounted on the substrate, operable to accumulate power for operating the current detector, the IV converter, the AD converter and the storage unit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
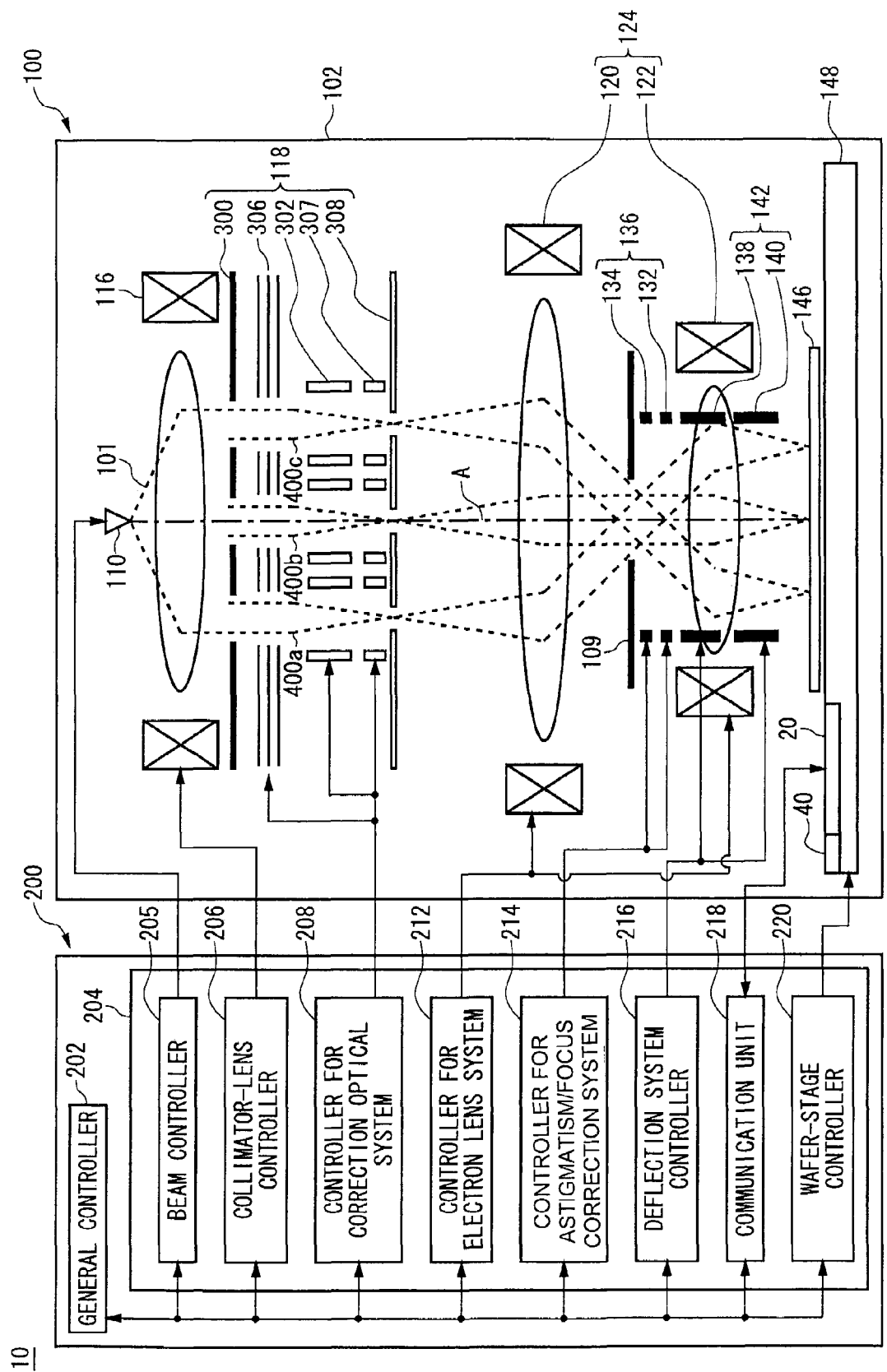
FIG. 1 illustrates an exemplary structure of an electron beam exposure apparatus 10 according to an embodiment of the present invention.

FIG. 1 illustrates an exemplary structure of an electron beam exposure apparatus 10 according to an embodiment of the present invention. The electron beam exposure apparatus 10 includes an optical system 100 for performing a predetermined exposure operation for wafer 146 by using an electron beam and a controlling system 200 that controls operations of respective components of the optical system 100. In the optical system 100 shown in FIG. 1, dashed line represents a lens axis A of an electron lens, while dotted line represents an electron beam 101.

The optical system 100 includes within a housing 102 an electron gun 110 as an exemplary electron beam generator that generates an electron beam; a collimator lens 116 for collimating the electron beam generated by the electron gun 110; a correction optical system 118 including an aperture array 300 for splitting the electron beam collimated by the collimator lens 116 into a plurality of electron beams; an electron lens system 124 for casting the split electron beams after reducing the size of each of the split electron beams; an astigmatism/focus correction system 136 for correcting deflection aberrations of the electron beams; a deflection system 142 for deflecting each electron beam to a position on the wafer 146 to be irradiated with that electron beam; a wafer stage 148 for holding the wafer 146; a beam measurement module 20, provided on the wafer stage 148, for measuring a current of the electron beam; and a condenser 40, provided on the wafer stage 148, that accumulates power for operating the beam measurement module 20.

The collimator lens 116 makes the electron beam generated by the electron gun 110 incident on a desired region in the correction optical system 118 to be substantially perpendicular to the desired region.

The correction optical system 118 includes the aperture array 300, an electrostatic lens array 306, a multi-deflector 302, a blanking aperture array 307 and a stopper array 308. The correction optical system 118 splits the electron beam incident thereon from the collimator lens 116 substantially perpendicularly into a plurality of electron beams and adjusts a focus position of each split electron beam.

The aperture array 300 has a plurality of apertures and splits the collimated beam incident thereon from the collimator lens 116 into a plurality of electron beams 400a, 400b, 400c, . . . that respectively travel a plurality of paths.

The electrostatic lens array 306 includes a plurality of electrostatic lenses and converges each of the electron beams split by the aperture array 300. The electrostatic lens array 306 converges each electron beam independently of the other electron beams and adjusts the focus position of that electron beam, thereby correcting distortion aberration caused by the electron lens system 124.

The multi-deflector 302 includes a plurality of deflection electrodes and deflects each of the split electron beams 400a, 400b, 400c, . . . separately from other split electron beams so as to correct a pitch of a two-dimensional array formed by the split electron beams and the like.

The blanking aperture array 307 includes a plurality of blanking electrodes and blanks each of the electron beams 400a, 400b, 400c, . . . for which the pitch was corrected by the multi-deflector 302, independently of other electron beams.

The stopper array 308 has a plurality of openings formed on a substrate and blocks the electron beam deflected by the blanking aperture array 307. The electron-beam that was not deflected by the blanking aperture array 307 passes through the opening of the stopper array 308 so as to be incident on the wafer 146.

The electron lens system 124 is a doublet formed by the first projection lens 120 and the second projection lens 122 arranged side by side in the direction of the lens axis A. In a case where the focal distance of the first projection lens 120 is f1 and that of the second projection lenses 122 is f2, the first and second projection lenses 120 and 122 are arranged away from each other by a distance corresponding to the sum of f1 and f2. The object point of the electron lens system 124 is positioned at the focus position of the first projection lens 120, while the image point of the electron lens system 124 is positioned at the focus position of the second projection lens 122. The electron lens system 124 reduces the cross-sectional area of the electron beam to f2/f1 times the original area. An objective diaphragm 109 determines the light amount of the electron beam that passed through the first projection lens 120 and defines the numerical aperture (NA) of the electron lens system 124.

The deflection system 142 includes a main deflector 138 and a sub-deflector 140. The main deflector 138 is used for deflection of the electron beam between sub-fields each including a plurality of shot areas each of which is an area that can be irradiated with one shot of electron beam. The sub-deflector 140 has smaller deflection amount than that of the main deflector 138, and is used for deflection between the shot areas in the sub-field. It is preferable that the main deflector 138 be an electromagnetic deflector and the sub-deflector 140 be an electrostatic deflector.

The astigmatism/focus correction system 136 includes an astigmatism correction lens 132 and a focus correction lens 134. The astigmatism/focus correction system 136 corrects deflection aberration generated when the deflection system 142 is operated, that is, deflection aberration based on the amount and direction of the deflection of the electron beam focused onto the wafer 146. The astigmatism correction lens 132 corrects astigmatism generated when the main deflector 138 and/or the sub-deflector 140 are/is operated. The focus correction lens 134 corrects a focus error that is displacement of the focus position caused when the main deflector 138 and/or the sub-deflector 140 are/is operated.

The beam measurement module 20 is provided on the wafer stage 148 in such a manner that it can be attached and removed to/from the wafer stage 148, and includes a plurality of Faraday cups for detecting currents of a plurality of electron beams, respectively, and a storage unit for storing digital data indicative of the currents detected by the Faraday cups. The electron beams 400a, 400b, 400c, . . . that were obtained by splitting the electron beam generated by the single electron gun 110 by means of the correction optical system 118 are detected by the associated Faraday cups of the beam measurement module 20, respectively. One Faraday cup may detect a plurality of ones of the split electron beams 400a, 400b, 400c, . . . at the same time. The current of the electron beam emitted from the electron gun 110 to the wafer 146 can be obtained as the sum of the current values of the electron beams 400a, 400b, 400c, . . . thus detected.

The condenser 40 is provided on the wafer stage 148 in such a manner that it can be attached and removed to/from the wafer stage 148, and accumulates power for operating the beam measurement module 20. The beam measurement module 20 and the condenser 40 are electrically connected via a contact, thereby the power for operating the beam measurement module 20 is supplied from the condenser 40.

The controlling system 200 includes a general controller 202 and an individual controller 204. The general controller 202 is a workstation, for example, and generally controls the respective controllers included in the individual controller 204. The individual controller 204 includes a beam controller 205, a collimator-lens controller 206, a controller for correction optical system 208, a controller for electron lens system 212, a controller for astigmatism/focus correction system 214, a deflection system controller 216, a communication unit 218 and a wafer-stage controller 220.

The beam controller 205 controls a voltage and/or a current applied to the electron gun 110, thereby adjusting the current of the electron beam generated by the electron gun 110.

The collimator-lens controller 206 controls a current applied to the collimator lens 116. Thus, the collimator-lens controller 206 makes the electron beam incident on a desired region in the correction optical system 118 to be substantially perpendicular to the desired region.

The controller for correction optical system 208 controls the respective parts of the correction optical system 118. More specifically, the controller for correction optical system 208 controls voltages respectively applied to a plurality of electrostatic lenses included in the electrostatic lens array 306. The controller for correction optical system 208 also controls voltages respectively applied to a plurality of blanking electrodes of the multi-deflector 302.

The controller for electron lens system 212 controls powers respectively applied to the first projection lens 120 and the second projection lens 122. More specifically, the controller for electron lens system 212 adjusts excitation of a coil of each of the first and second projection lenses 120 and 122 so as to allow the first and second projection lenses 120 and 122 to form a doublet.

The deflection system controller 216 controls the amount of deflection of the electron beam by the main deflector 138 and the sub-deflector 140. The controller for astigmatism/focus correction system 214 adjusts powers respectively supplied to the astigmatism correction lens 132 and the focus correction lens 134 based on the amount and direction of deflection of the electron beam by the main deflector 138 and/or the sub-deflector 140. The controller for astigmatism/focus correction system 214 performs that adjustment in synchronization with a signal from the deflection controller 216 for controlling the main deflector 138 and/or the sub-deflector 140.

The communication unit 218 obtains information indicating the current of the electron beam that was detected by the beam measurement module 20 and was stored therein from the beam measurement module 20 and outputs that information to the general controller 202. The communication unit 218 also obtains a control signal, that is a signal output from the general controller 202 for controlling the beam measurement module 20, from the general controller 202 and then outputs the control signal to the beam measurement module 20. The communication unit 218 modulates the information or signal to be transmitted into a signal of wireless carrier, such as an optical signal or RF signal, and performs communication between the beam measurement module 20 and the general controller 202 at predetermined timings. In a case where the wafer stage 148 is located at a predetermined position with respect to the housing 102, the communication unit 218 may perform transmission by bringing a terminal provided on the wafer stage 148 and a terminal provided on the housing 102 into contact with each other. In addition, the communication by the communication unit 218 may have effects on the paths of the electron beams. Therefore, it is desirable that the communication unit 218 perform no communication during the exposure operation for the wafer 146, or the measurement of the beam current by the beam measurement module 20.

The wafer-stage controller 220 moves the wafer stage 148 to a desired position. More specifically, the wafer-stage controller 220 performs servo-control for a driving motor in such a manner that a measurement value from a laser interferometer that measures a positional coordinate of the wafer stage 148 falls within a predetermined error range with respect to a target position that was instructed.

In a case where the electron beam exposure apparatus 10 performs exposure for the wafer 146, various adjustment processes are performed prior to the exposure. The adjustment processes are typically performed regularly at a predetermined interval. The adjustment processes include adjustments of the collimator lens 116, the correction optical system 118, the electron lens system 124, the astigmatism/focus correction system 136, the deflection system 142, the electron gun 110 and the wafer stage 148. Please note that the electron gun 110 is used in such a state that a temperature of a filament was set and the electron gun 110 continues to emit the electron beam. Therefore, in a case where it is not necessary to make the electron beam incident on the wafer stage 148, the general controller 202 controls the blanking aperture array 307 to deflect the electron beams.

In the adjustment of the collimator lens 116, the collimator-lens controller 206 adjusts the collimator lens 116 so as to make the electron beam incident on a desired region in the correction optical system 118 to be substantially perpendicular to the desired region. In the adjustment of the correction optical system 118, the controller for the correction optical system 208 adjusts a plurality of electrostatic lenses of the electrostatic lens array 306 in such a manner that a plurality of split electron beams are respectively converged under desired converging conditions. In the adjustment of the electron lens system 124, the controller for electron lens system 212 adjusts the first and second projection lenses 120 and 122 in such a manner that a plurality of electron beams have desired orientations and desired shot-sizes on the wafer 146, respectively.

In the adjustment of the deflection system 142, the deflection system controller 216 adjusts the main deflector 138 and the sub-deflector 140 so as to allow a plurality of electron beams to be incident onto a desired region on the wafer 146. In the adjustment of the astigmatism/focus correction system 136, the controller for astigmatism/focus correction system 214 adjusts the astigmatism correction lens 132 and the focus correction lens 134 so as to correct the astigmatism/focus error caused by the deflection aberration of the electron beam by the main deflector 138 and/or the sub-deflector 140.

In the adjustment of the electron gun 110, the general controller 202 controls the beam controller 205 based on the current of the electron beam that was emitted from the electron gun 110 and detected by the measurement module 20. More specifically, the wafer-stage controller 220 first controls the position of the wafer stage 148 in such a manner that the electron beams are incident on the Faraday cups of the beam measurement module 20. When deciding that the beam measurement module 20 is at such a position that it can measure the currents of the electron beams, the general controller 202 stops the deflection of electron beam by the multi-deflector 302. After the deflection of electron beam by the multi-deflector 302 was stopped, the electron beams are incident on the Faraday cups of the beam measurement module 20. Then, the beam measurement module 20 measures the currents of the incident electron beams in accordance with a predetermined procedure and then stores information indicating the measured currents as digital data in the storage unit.

The general controller 202 obtains the information stored in the beam measurement module 20 via the communication unit 218. Then, the general controller 202 determines a correction value for the output of the electron gun 110 based on the obtained information. The beam controller 205 obtains the correction value for the output of the electron gun 110 determined by the general controller 202 and then determines a voltage applied to the electron gun 110 based on the obtained correction value. After the voltage applied to the electron gun 110 was determined, the general controller 202 deflects the electron beam by the multi-deflector 302, thus the adjustment processes are finished.

When the above-described series of adjustment processes were finished, wafer 146 for which the exposure is to be performed is placed on the wafer stage 148. The wafer-stage controller 220 moves the wafer stage 148 so as to position a region on the wafer 146, that is to be exposed, in the vicinity of the lens axis A.

When the wafer stage 148 placed the wafer 146 at a predetermined position, the general controller 202 stops deflection of electron beam by the blanking aperture array 307. Thus, the electron beam is made incident on the wafer 146 in the following manner.

First, the electron gun 110 generates an electron beam in accordance with the output adjusted in the aforementioned adjustment process. The collimator lens 116 collimates the electron beam generated by the electron gun 110 and makes it incident on a desired region in the correction optical system 118 to be substantially perpendicular to the desired region. In the correction optical system 118, the aperture array 300 splits the electron beam from the collimator lens 116 into a plurality of electron beams. The electrostatic lens array 306 then adjusts the focuses of the respective split electron beams. The multi-deflector 306 adjusts the pitch of the two-dimensional array of the split electron beams. The blanking aperture array 307 applies voltages to the respective blanking electrodes so as to switch whether or not each of the electron beams for which the pitch was adjusted is allowed to be incident on the wafer 146. The electron beam that was not deflected by the blanking aperture array 307 passes through the opening of the stopper array 308. The electron beam deflected by the blanking aperture array 307 cannot pass through the opening of the stopper array 308, i.e., is blocked by the stopper array 308.

Then, the electron lens system 124 reduces the sizes of the split electron beams and then makes the split electron beams incident on the wafer 146 in such a manner that the focuses of the electron beams are on the wafer 146. The deflection system 142 deflects the electron beams by the main deflector 138 and the sub-deflector 140 so as to make the electron beams incident onto a predetermined shot area on the wafer 146. The astigmatism/focus correction system 136 corrects astigmatism generated when the main deflector 138 and/or the sub-deflector 140 are/is operated by means of the astigmatism correction lens 132 and also corrects the displacement of the focus position generated when the main deflector 138 and/or the sub-deflector 140 are/is operated by means of the focus correction lens 134. Thus, the electron beams are incident on the wafer 146, thereby a reduced image of crossover of the electron gun 110 is transferred on the predetermined shot area on the wafer 146. By the aforementioned process, the electron beam exposure apparatus 10 draws a desired pattern in the desired shot area on the wafer 146 by using multiple beams obtained by splitting by the aperture array 300.

The electron beam exposure apparatus 10 described above stores the current of the electron beam measured by the beam measurement module 20 after converting the measured current value to digital data in the measurement module 20. Thus, necessary wiring length can be reduced. Therefore, even in a case where the current of the electron beam is very weak, it is possible to reduce loss in transmission of analog data and degradation of S/N ratio occurring in the transmission of analog data. Accordingly, the general controller 202 and the beam controller 205 can control the output of the electron gun 110 with high precision based on the information about the current of the electron beam that was measured and transmitted with high precision.

Figure 2:
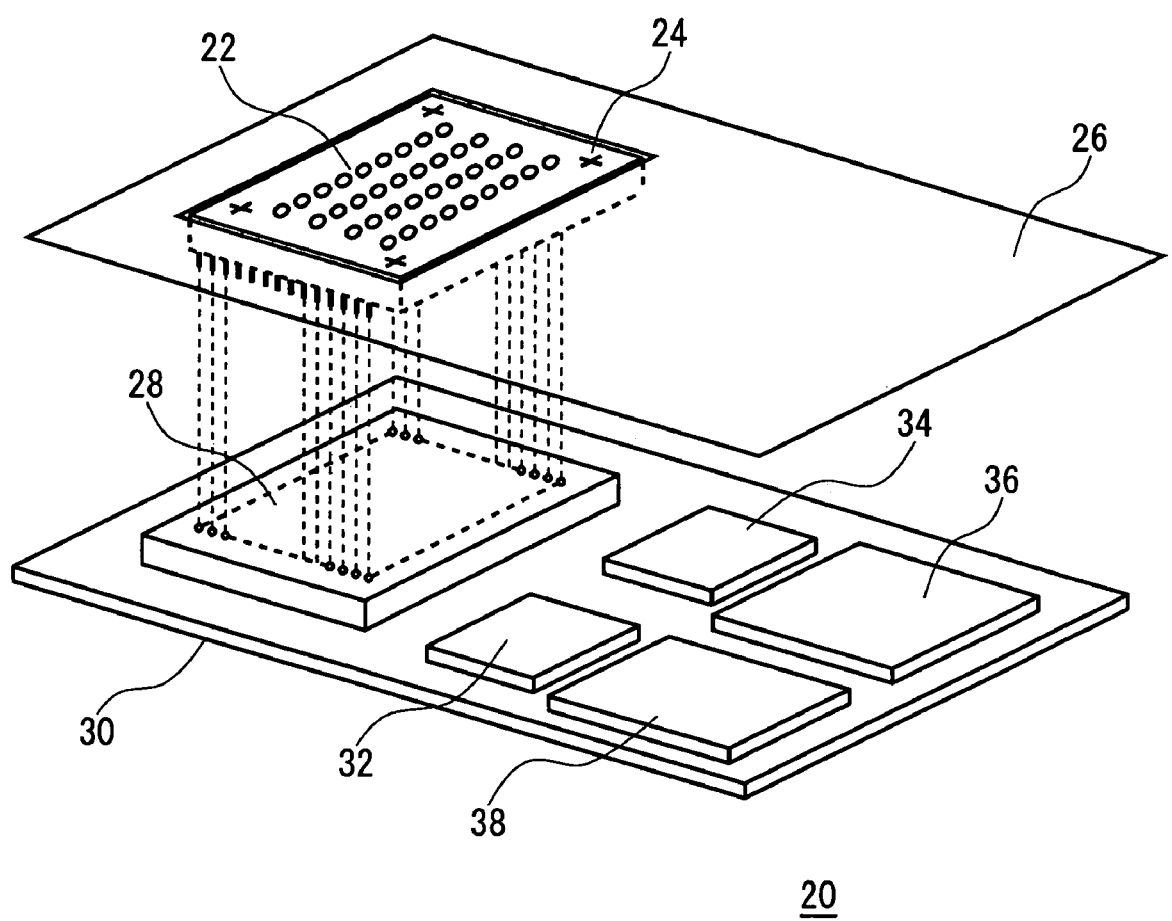
FIG. 2 illustrates an exemplary detailed structure of a beam measurement module 20 according to the embodiment of the present invention.

FIG. 2 illustrates an exemplary detailed structure of the beam measurement module 20 according to the present embodiment. The beam measurement module 20 includes a module substrate 30 that can be attached and removed to/from the wafer stage 148, a Faraday cup array 22 having a plurality of Faraday cups that are arranged for detecting currents of electron beams, a socket 28, mounted on the module substrate 30, for electrically connecting the Faraday cup array 22 to the module substrate 30, an IV amplifier 32, mounted on the module substrate 30, for converting the currents of the electron beams detected by the Faraday cup array 22 to voltages, an AD converter 34 for converting the voltages from the IV amplifier 32 to digital signals, a memory 36 for storing the digital signal from the AD converter 34, a shield plate 26, formed of conductive material, for shielding the beam measurement module 20 from the electron beam, and a condenser 38 that accumulates power for operating the beam measurement module 20. The beam measurement module 20 may include the above-listed components integrally.

The beam measurement module 20 is an exemplary electron beam measurement module of the present invention. The Faraday cup array 22 is an exemplary current detector of the present invention. The IV amplifier 32 is an exemplary IV converter of the present invention. The AD converter 34 is an exemplary AD converter of the present invention. The memory 36 is an exemplary storage unit of the present invention. The module substrate 30 is an exemplary substrate of the present invention. In a case where the condenser 40 described referring to FIG. 1 is provided on the wafer stage 148, the condenser 38 is not required.

The Faraday cup array 22 is formed by packaging an array of a plurality of Faraday cups in form of PGA (Pin-Grid-Array) or the like. In the Faraday cup array 22, a plurality of terminals corresponding to the respective Faraday cups are exposed on the rear surface. The Faraday cup array 22 has a reference mark 24 used for detection of the position of the Faraday cup array 22 on the top surface of the package. The reference mark 24 has a size that allows detection of the position by an alignment scope. The socket 28 connects a plurality of terminals exposed on the rear surface of the Faraday cup array 22 to the module substrate 30. The socket 28 holds the Faraday cup array 22 in such a manner that the Faraday cup array can be attached and removed to/from the socket 28. The shield plate 26 is earthed at its peripheral region so that the entire shield plate 26 is kept to be substantially equipotential. The Faraday cup array 22 may be packaged to be such a form that allows the Faraday cup array 22 to be mounted directly onto the module substrate 30, such as BGA (Ball-Grid-Array). In this case, it is unnecessary to provide the socket 28.

According to the beam measurement module 20 having the aforementioned structure, the currents of the electron beams detected by the Faraday cup array 22 can be stored as digital data within the beam measurement module 20. Therefore, transmission loss of the data can be suppressed as compared to a case where the measured current values are transmitted via a wiring to a circuit in the outside of the stage. Moreover, since the wiring by a cable is reduced, a stray capacitance in the circuit and a disturbance noise can be reduced. In addition, in a case where the Faraday cup array 22 deteriorated, it is easy to replace that the beam measurement module 20 with a new one because the beam measurement module 20 is attached to the wafer stage 148 in such a manner that it can be removed and attached from/to the wafer stage 148. Furthermore, by mounting the condenser 38 onto the module substrate 30, transmission efficiency of the power can be increased as compared to a case where the condenser is provided in the outside of the module substrate 30, thus reducing a noise generated by the power transmission.

Figure 3:
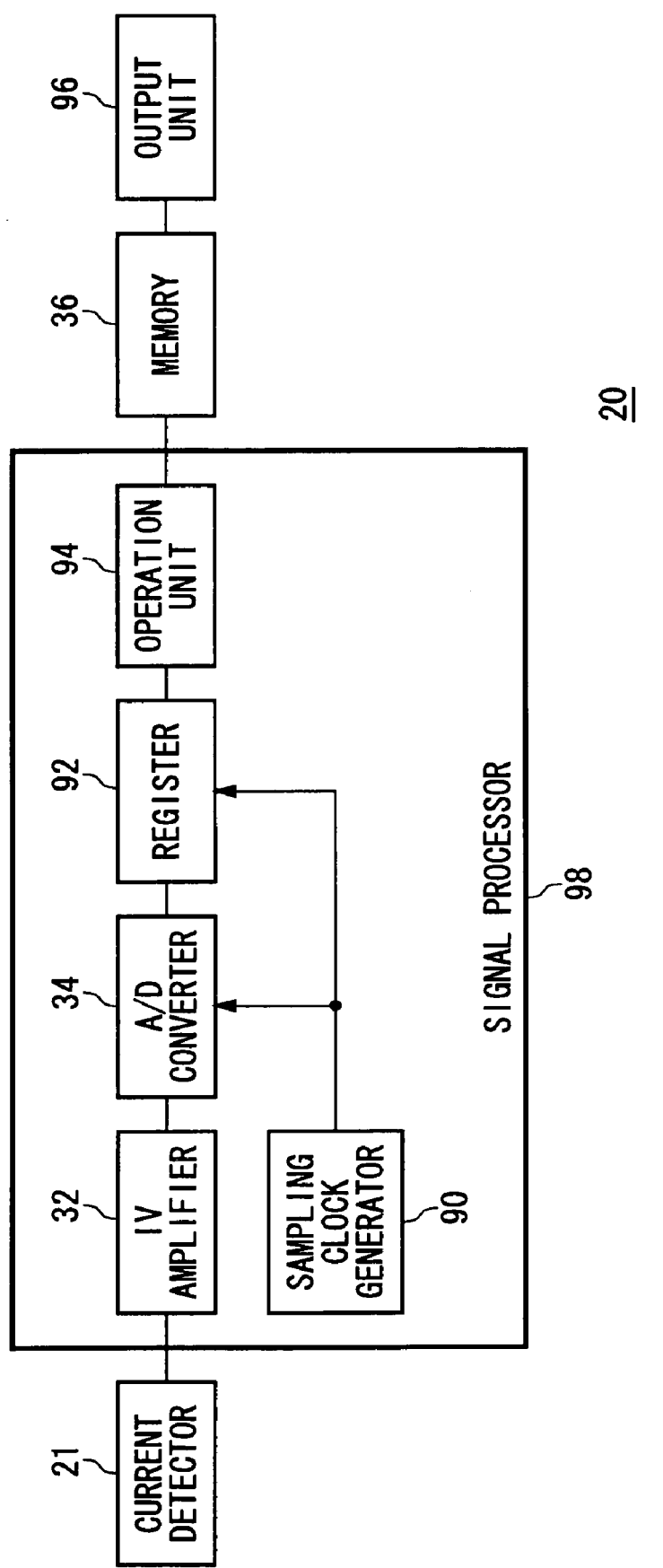
FIG. 3 illustrates an example of functional blocks of the beam measurement module 20.

FIG. 3 is an example of functional blocks of the beam measurement module 20 according to the present embodiment. The beam measurement module 20 includes a current detector 21 for detecting a current of an electron beam, a signal processor 98 for converting the current detected by the current detector 21 to a digital signal, a memory 36 for storing the digital signal obtained by the conversion by the signal processor 98 and an output unit 96 for outputting information stored in the memory 36. The signal processor 98 includes an IV amplifier 32, an AD converter 34, a register 92, a sampling clock generator 90 and an operation unit 94. In a case where the current detector includes a plurality of Faraday cups as a Faraday cup array, it is preferable that the beam measurement module 20 include the same number of the functional blocks shown in FIG. 3 as the number of the Faraday cups included in the beam measurement module 20.

The current detector 21 detects the current of the electron beam incident thereon. The IV amplifier 32 converts the current detected by the current detector 21 to a voltage. The AD converter 34 converts a value of the voltage output from the IV amplifier 32 to a digital value in synchronization with the first sampling clock generated by the sampling clock generator 90. The register 92 gets in the digital value generated by the AD converter 34 in synchronization with the second sampling clock generated by the sampling clock generator 90. The operation unit 94 calculates an average value of a plurality of digital values got into the register 92. The memory 36 stores the average value calculated by the operation unit 94 therein as digital data indicating the measured current value of the electron beam. The output unit 96 outputs the digital data stored in the memory 36 at a predetermined timing.

Figure 4:
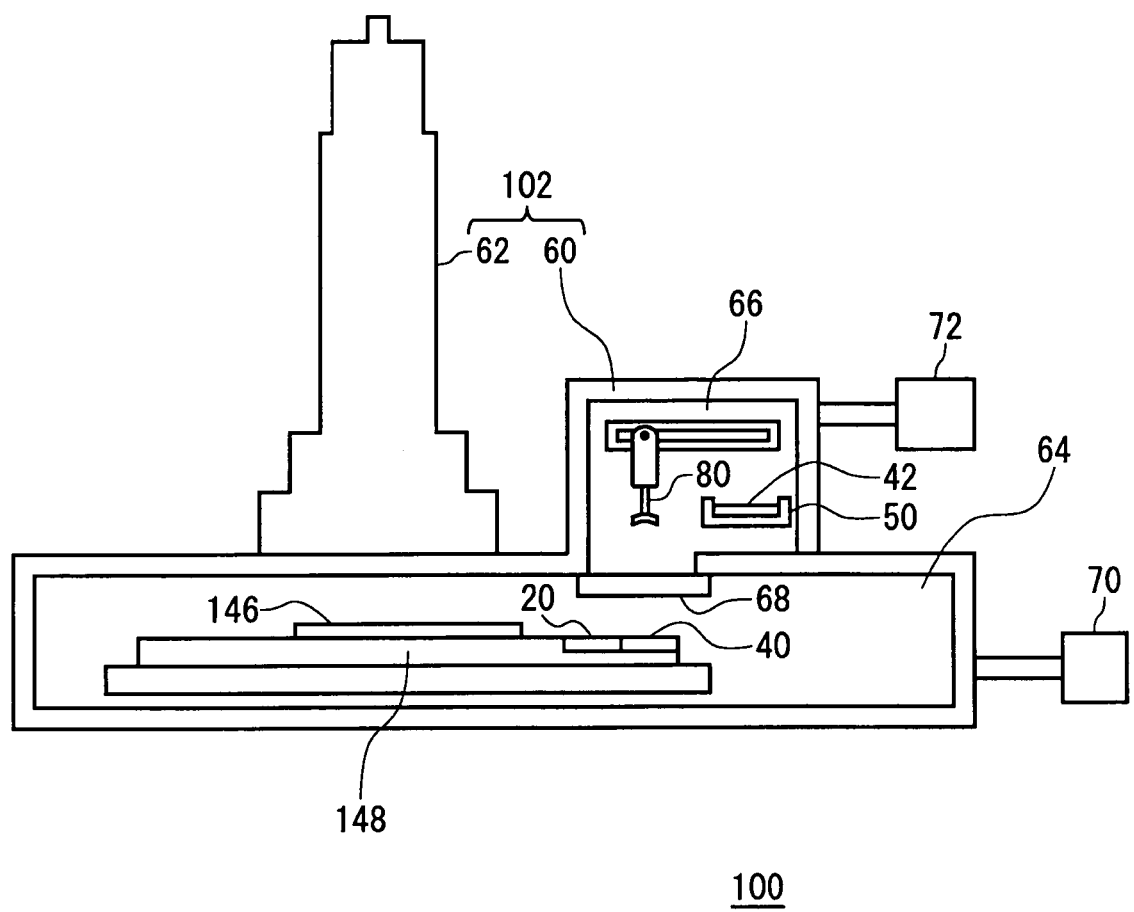
FIG. 4 supplements a structure of an optical system 100.

FIG. 4 supplements the structure of the optical system 100 shown in FIG. 1. The optical system 100 further includes a lens-barrel 62 for accommodating the electron gun 110, the collimator lens 116, the correction optical system 118 and the like, that are described referring to FIG. 1; a chamber 60 for accommodating the wafer stage 148; a charging unit 50 for charging the condenser 40; a shutter 68 for dividing a space within the chamber 60 into a space 64 for accommodating the wafer stage 148 and a stage 66 for accommodating the charging unit 50; a pump 70 for decreasing the pressure within the space 64; a pump 72 for decreasing the pressure within the space 66; an arm 80 for removing the condenser 40 from the wafer stage 148 and attaching it to the charging unit 50; and a condenser 42 for accumulating the power required for operating the beam measurement module 20. The charging unit 50 holds and charges the condenser 42. The lens-barrel 62 is an exemplary chamber according to the present invention. The arm 80 is an exemplary attaching/removing unit according to the present invention. The condenser 42 is an exemplary second condenser of the present invention.

In a case where the amount of accumulated charges in the condenser 40 comes short, the condenser 40 is replaced with the condenser 42 in the following manner. First, the pump 72 decreases the pressure within the space 66 to a pressure substantially equal to the pressure in the space 64. When the pressure decrease in the space 66 was finished, the shutter 68 is opened. After the shutter 68 was opened, the arm 80 removes the condenser 40 held by the wafer stage 148 from the wafer stage 148 and attaches the removed condenser 40 to the charging unit 50. The arm 80 also removes the condenser 42 charged by the charging unit 50 from the charging unit 50 and attaches the removed condenser 42 to the wafer stage 148. When the replacement of the condenser was finished, the shutter 68 is closed. In this manner, the condenser 40 that was discharged by supplying the power for operating the beam measurement module 20 is charged again by the charging unit 50, while the condenser 42 that was completely charged supplies the power for operating the beam measurement module 20.

The arm 80 may replace the beam measurement module 20 with a new one. In this case, the optical system 100 may further include a stock space for accommodating a spare beam measurement module in the space 66. It is preferable that the replacement for the condenser 40 and the replacement for the beam measurement module 20 be performed simultaneously with the replacement for the wafer 146 or various adjustments.

According to the optical system 100 mentioned above, it is possible to replace the condenser 40 or the beam measurement module 20 with a new one without changing the pressure in the chamber 60 that accommodates the wafer stage 148. Therefore, the optical system 100 can keep the vacuum in the chamber 60 even when the condenser 40 or the beam measurement module 20 is replaced with the new one, thus keeping the operating rate of the electron beam exposure apparatus 10 high.

According to the electron beam exposure apparatus 10 mentioned above, it is possible to expose wafer by using precise amount of exposure light because the current of the electron beam is controlled with high precision. Moreover, in a case where multiple electron beams are used, the wiring from the wafer stage 148 does not increase. Therefore, a physical load on the wafer stage 148 can be reduced, improving the dynamic characteristics of the wafer stage 148 and the precision of control of the position of the wafer stage 148.

In the present embodiment, an example is described in which the electron beam exposure apparatus 10 includes a single electron gun 110. Alternatively, the electron beam exposure apparatus 10 may include a plurality of electron guns 110. Moreover, the electron beam exposure apparatus 10 may be an electron beam exposure apparatus using a variable rectangle.

As is apparent from the above description, according to the present invention, it is possible to provide an electron beam exposure apparatus that can perform exposure for wafer with high lithography precision by controlling a current of an electron beam with high precision.

Although the present invention has been described by way of exemplary embodiments, it should be understood that those skilled in the art might make many changes and substitutions without departing from the spirit and the scope of the present invention which is defined only by the appended claims.

What is claimed is:

1. An electron beam exposure apparatus for exposing wafer by using an electron beam, comprising:
    an electron beam generator operable to generate said electron beam;
    a wafer stage operable to hold said wafer to be exposed;
    a current detector, provided on said wafer stage, operable to detect a current of said electron beam; and
    a storage unit, provided on said wafer stage, operable to store information indicating said current detected by said current detector.

2. An electron beam exposure apparatus as claimed in claim 1, wherein said current detector includes a Faraday cup.

3. An electron beam exposure apparatus as claimed in claim 1, further comprising a signal processor, provided on said wafer stage, operable to convert said current detected by said current detector to a digital signal and to output said digital signal to said storage unit.

4. An electron beam exposure apparatus as claimed in claim 3, wherein said signal processor includes:
    an IV converter operable to convert said current detected by said current detector to a voltage; and
    an AD converter operable to convert said voltage to said digital signal and to output said digital signal to said storage unit.

5. An electron beam exposure apparatus as claimed in claim 3, further comprising a substrate provided in such a manner that said substrate is attachable and removable to/from said wafer stage, said current detector, said signal processor and said storage unit being provided on said substrate.

6. An electron beam exposure apparatus as claimed in claim 1, further comprising a first condenser, provided on said wafer stage, operable to accumulate power for operating said current detector and said storage unit.

7. An electron beam exposure apparatus as claimed in claim 6, further comprising a charging unit operable to charge said first condenser.

8. An electron beam exposure apparatus as claimed in claim 7, further comprising:
    a chamber operable to accommodate said wafer stage and said charging unit;
    a shutter operable to divide a space within said chamber into a first space for accommodating said wafer stage and a second space for accommodating said charging unit;
    a first pump operable to decrease a pressure in said first space;
    a second pump operable to decrease a pressure in said second space; and
    an attaching/removing unit operable to remove said first condenser from said wafer stage and attach said first condenser to said charging unit.

9. An electron beam exposure apparatus as claimed in claim 8, further comprising a second condenser operable to accumulate power for operating said current detector and said storage unit, wherein
    said attaching/removing unit removes said first condenser from said wafer stage and attaches said first condenser to said charging unit, and removes said second condenser from said charging unit and attaches said second condenser to said wafer stage.

10. An electron beam exposure apparatus as claimed in claim 1, further comprising a communication unit operable to communicate said information stored in said storage unit; and
    an electron beam controller operable to control an output of said electron beam generator based on said information obtained via said communication unit.

11. An electron beam measurement module for measuring a current of an electron beam, comprising:
    a current detector operable to detect said current of said electron beam;
    a storage unit operable to store information indicating said current detected by said current detector; and
    a substrate on which said current detector and said storage unit are mounted.

12. An electron beam measurement module as claimed in claim 11, further comprising:
    an IV converter, mounted on said substrate, operable to convert said current detected by said current detector to a voltage; and
    an AD converter, mounted on said substrate, operable to convert said voltage to a digital signal and to output said digital signal to said storage unit.

13. An electron beam measurement module as claimed in claim 12, further comprising a condenser, mounted on said substrate, operable to accumulate power for operating said current detector, said IV converter, said AD converter and said storage unit.

* * * * *